United States Patent [19]
Anderson

[11] Patent Number: 5,864,246
[45] Date of Patent: Jan. 26, 1999

[54] METHOD AND APPARATUS FOR DOUBLING A CLOCK SIGNAL USING PHASE INTERPOLATION

[75] Inventor: Michael B. Anderson, Colorado Springs, Colo.

[73] Assignee: LSI Logic Corporation, Milpitas, Calif.

[21] Appl. No.: 828,496

[22] Filed: Mar. 31, 1997

[51] Int. Cl.[6] .................................................. H03B 19/00
[52] U.S. Cl. ........................................ 327/122; 327/116
[58] Field of Search ..................................... 327/122, 113, 327/114, 116, 119, 120, 238, 254, 255, 231; 326/52, 53

[56] References Cited

U.S. PATENT DOCUMENTS

| | | | |
|---|---|---|---|
| 3,778,727 | 12/1973 | Williams | 327/31 |
| 3,911,368 | 10/1975 | Tarczy-Hornoch | 327/237 |
| 4,267,514 | 5/1981 | Kimsey | 328/133 |
| 4,737,721 | 4/1988 | Lippl | 327/116 |
| 4,851,785 | 7/1989 | Gehrt et al. | 327/49 |
| 4,949,364 | 8/1990 | Yukawa | 327/238 |
| 4,956,797 | 9/1990 | Berard | 326/52 |
| 5,297,179 | 3/1994 | Tatsumi | 377/47 |
| 5,399,995 | 3/1995 | Kardontchik et al. | 331/17 |
| 5,448,196 | 9/1995 | Kanbara et al. | 327/231 |
| 5,485,490 | 1/1996 | Leung et al. | 375/371 |
| 5,554,945 | 9/1996 | Lee et al. | 327/105 |
| 5,614,841 | 3/1997 | Marbot et al. | 327/116 |

OTHER PUBLICATIONS

Serial IO Interpolator Discussion "Phase Interpolator"; http://iram.cs.berkeley.edu/serialio/cs254/interpolator/interp.html.

Sidiropoulos, S. and Horowitz, M., "A Semidigital Dual Delay–Locked Loop"; IEEE Journal of Solid–State Circuits, vol. 32, No. 11, Nov. 1997.

Horowitz, M. et al.; ISSCC 1993 IEEE International Solid–State Circuits Conference; Session 10, High–Speed Communication and Interfaces; Paper TP 10.5, "PLL Design for a 500 MB/s Interface".

*Primary Examiner*—Toan Tran
*Attorney, Agent, or Firm*—Wayne P. Bailey; Duke W. Yee

[57] ABSTRACT

A circuit for multiplying a clock signal. The circuit includes a phase interpolator having two inputs for receiving complementary clock signals. The output of the phase interpolator is connected to an input in an exclusive OR gate. One of the two complementary input signals also is sent into the exclusive OR gate, wherein a multiplied clock signal is generated at the output of the exclusive OR gate.

17 Claims, 6 Drawing Sheets

METHOD AND APPARATUS FOR DOUBLING A CLOCK SIGNAL USING PHASE INTERPOLATION

BACKGROUND OF THE INVENTION

1. Technical Field:

The present invention relates generally to a clock generation system and in particular to a method and apparatus for multiplying the frequency of a clock signal.

2. Description of the Related Art:

It is known that signals that are ninety degrees out of phase can be XORed together to create a new signal that is twice the frequency of the original signal XORed. Turning to FIG. 1, a schematic diagram of a clock doubling circuit known in the art is illustrated. Circuit 100 is an XOR gate 102 that receives input clock signals 104 and 106. Input clock signal 104 is ninety degrees out of phase with input clock signal 106. XOR gate 102 XORs together input clock signals 104 and 106 to generate output clock signal 108, which is twice the frequency of the input signals. Both input clock signal 104 and input clock signal 106 have the same frequency. As mentioned above, the difficulty in producing output clock signal 108 with a frequency twice that of the input clock signals lies in producing input clock signals that are ninety degrees out of phase. Therefore, it would be advantageous to have a method and apparatus for doubling the frequency of a signal while reducing the difficulty in generating the clock signals that are ninety degrees out of phase.

SUMMARY OF THE INVENTION

The present invention provides a circuit for multiplying a clock signal. The circuit includes a phase interpolator having two inputs for receiving complementary clock signals. The output of the phase interpolator is connected to an input in an exclusive OR gate. One of the two complementary input signals also is sent into the exclusive OR gate, wherein a multiplied clock signal is generated at the output of the exclusive OR gate.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
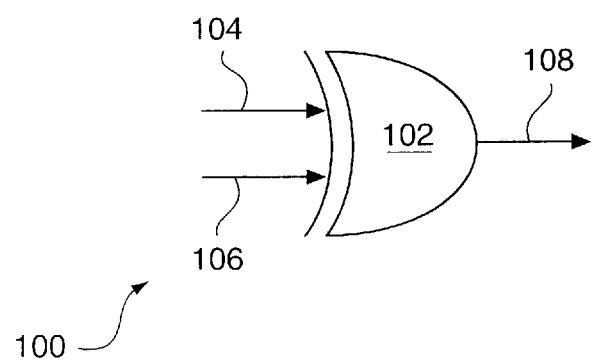
FIG. 1 is a schematic diagram of a clock doubling circuit known in the art.
Figure 2:
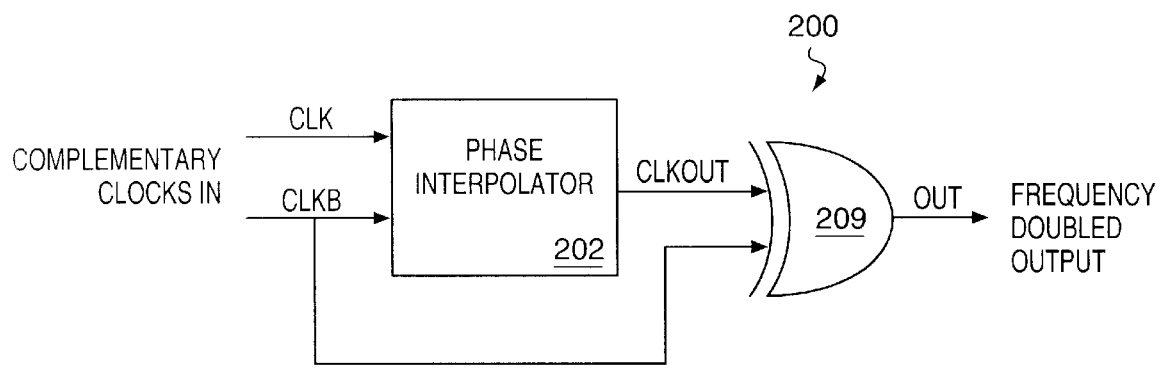
FIG. 2 is a schematic diagram of a clock doubling circuit according to the present invention.

With reference now to the figures and in particular with reference to FIG. 2, a schematic diagram of a clock doubling circuit is illustrated according to the present invention. Circuit 200 includes a phase interpolator 202 and an XOR gate 204. Phase interpolator 202 has an input for a clock signal CLK and a complementary clock signal CLKB. The output of phase interpolator 202 is fed into one of the inputs of XOR gate 204. Clock signal CLKB also is sent into an input of XOR gate 204. The output of XOR gate 204 is a clock signal OUT. Phase interpolator 202 generates an output signal CLKOUT that has a phase that is precisely between the two original input signals. In the depicted example, signals CLK and CLKB are one hundred eighty degrees out of phase resulting in the output signal of phase interpolator 202 having a ninety degrees phase difference between the original signals. Signal CLKOUT when XORed with clock signal CLKB produces a frequency double output signal OUT.

Figure 3:
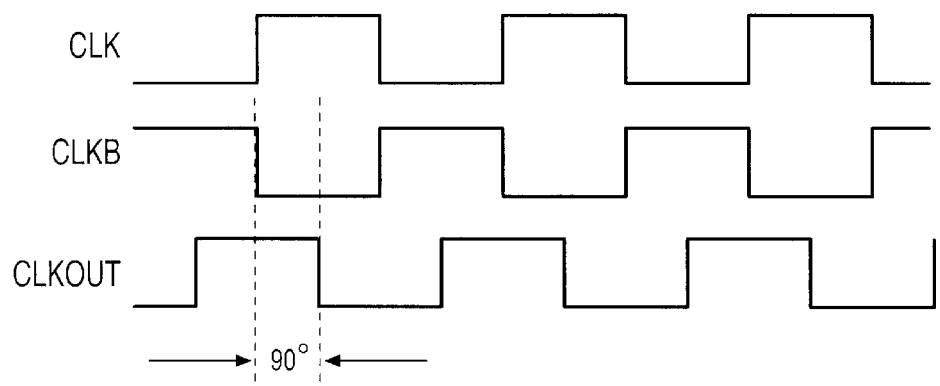
FIG. 3 is a timing diagram of input signals and an output signal in a phase interpolator according to the present invention.
Figure 4:
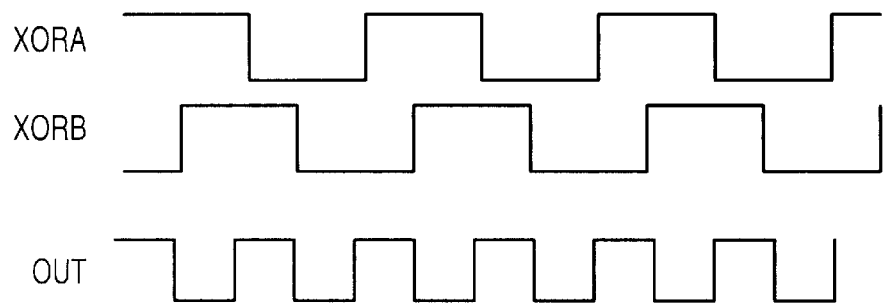
FIG. 4 is a timing diagram of input signals into an XOR gate and an output signal resulting from the input signals according to the present invention.

Turning to FIG. 3, a timing diagram of input signals CLK and CLKB and an output signal CLKOUT in a phase interpolator according to the present invention. The output signal CLKOUT has a ninety degrees phase difference between the two clock signals CLK and CLKB. The output signal CLKOUT is sent into XOR gate 204 along with clock signal CLKB as can be seen in FIG. 4, which is a timing diagram of input signals, XORA and XORB, into XOR gate 204 and an output signal OUT resulting from the input signals. As can be seen, the output signal OUT has a frequency that is twice that of the input signals.

Thus, the present invention provides an improved method and apparatus for frequency multiplication, clock doubling, which is achieved by the use of a phase interpolator to create a ninety degree phase shifted signal from complementary clock signals. The phase shifted output signal is XORed with one of the original clock signals, either CLK or CLKB, to produce a frequency multiplied output signal.

Figure 5:
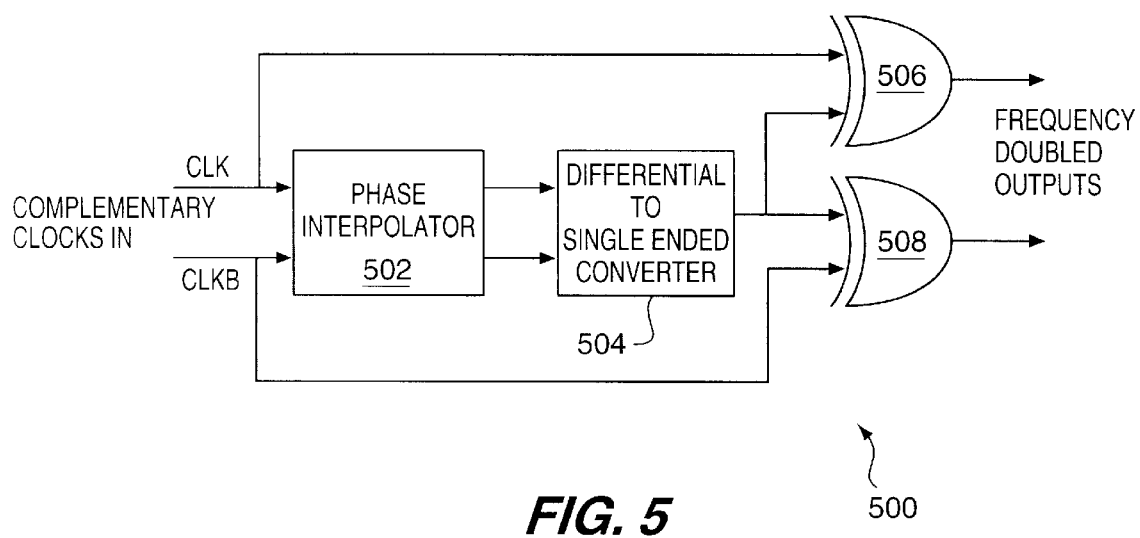
FIG. 5 is a schematic diagram of a clock doubling circuit with doubled outputs according to the present invention.

Turning now to FIG. 5, a schematic diagram of a clock doubling circuit with doubled outputs is depicted according to the present invention. Circuit 500 includes a phase interpolator 502 which receives complementary clock signals and generates two phase interpolator signals that are sent to differential to single ended converter 504. The output of differential to single ended converter 504 is sent to XOR gates 506 and 508. XOR gate 506 also receives the signal CLK as an input while XOR gate 508 receives the signal CLKB as an input. Frequency doubled outputs are generated at the outputs of XOR gates 506 and 508. In this depicted example, the clock doubler circuit 500 is configured to compare performance to a phase locked loop circuit.

Figure 6:
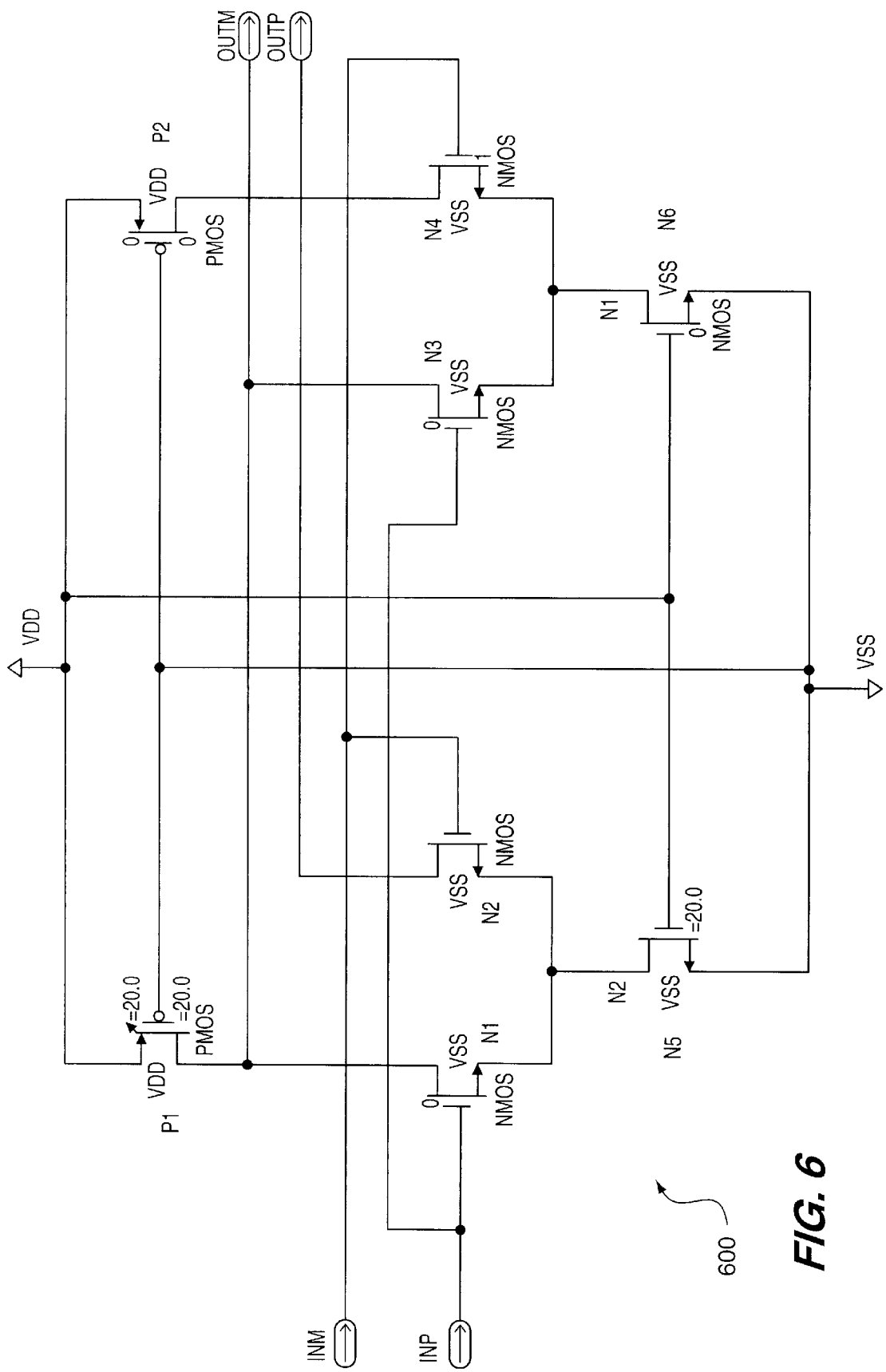
FIG. 6 is a schematic diagram of a phase interpolator according to the present invention.

Turning now to FIG. 6, a schematic diagram of a phase interpolator is depicted according to the present invention. Phase interpolator 600 is a more detailed schematic diagram of phase interpolator 502 in FIG. 5. Phase interpolator 600 includes transistors in N1–N6, which are n channel metal oxide semiconductor (NMOS) transistors. Additionally, phase interpolator circuit 600 also contains transistors P1 and P2, which are p channel metal oxide semiconductor (PMOS) transistors. Complementary clock signals are input at inputs INM and INP. Outputs OUTM and OUTP provide the outputs that are connected to a differential to single in a converter, such as differential to single in a converter 504 in FIG. 5. Phase interpolator 502 is powered by connecting the circuit to an upper power supply voltage, such as power supply voltage VDD, and a lower power supply voltage, such as power supply voltage. Phase interpolator 600 requires no bias inputs in the depicted example.

Figure 7:
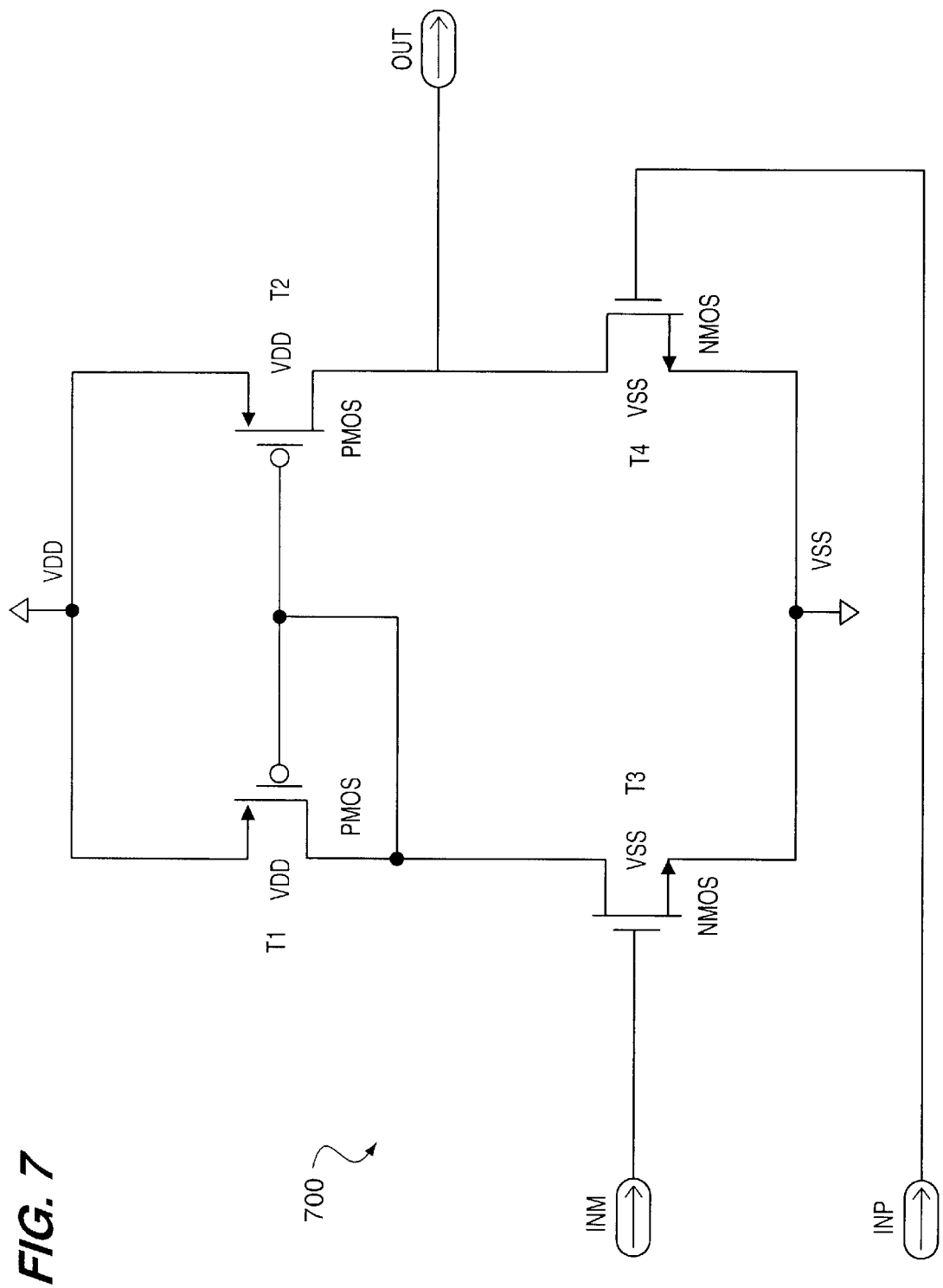
FIG. 7 is a schematic diagram of a differential to single ended converter according to the present invention.

Turning next to FIG. 7, a schematic diagram of a differential to single ended converter is depicted according to the present invention. Differential to single ended converter 700 is a detailed schematic diagram of differential to single ended converter 504 from FIG. 5. Differential to single ended converter 700 includes transistors T1–T4 in which transistors T1 and T2 are PMOS transistors while transistors T3 and T4 are NMOS transistors. Inputs INM and INP are connected to a phase interpolator, such as phase interpolator 502 in FIG. 5. The output OUT in differential to single ended converter 700 is connected to XOR gates such as XOR gates 506 and 508 in FIG. 5. The circuit is powered by a connection to power supply voltage VDD and VSS.

Figure 8A:
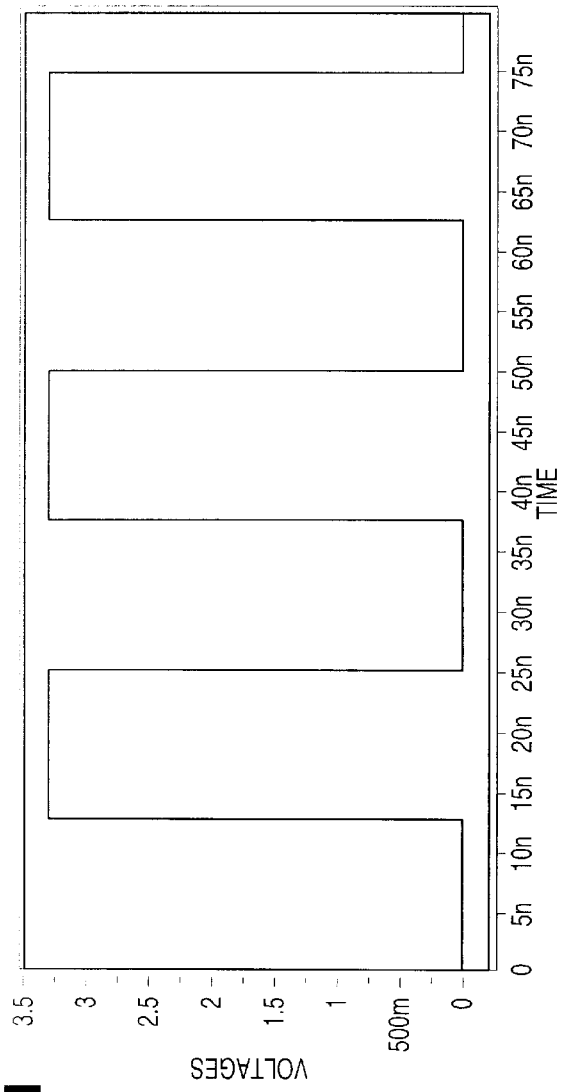
FIGS. 8A and 8B are timing diagrams from simulation results of input and output signals according to the present invention.
Figure 8B:
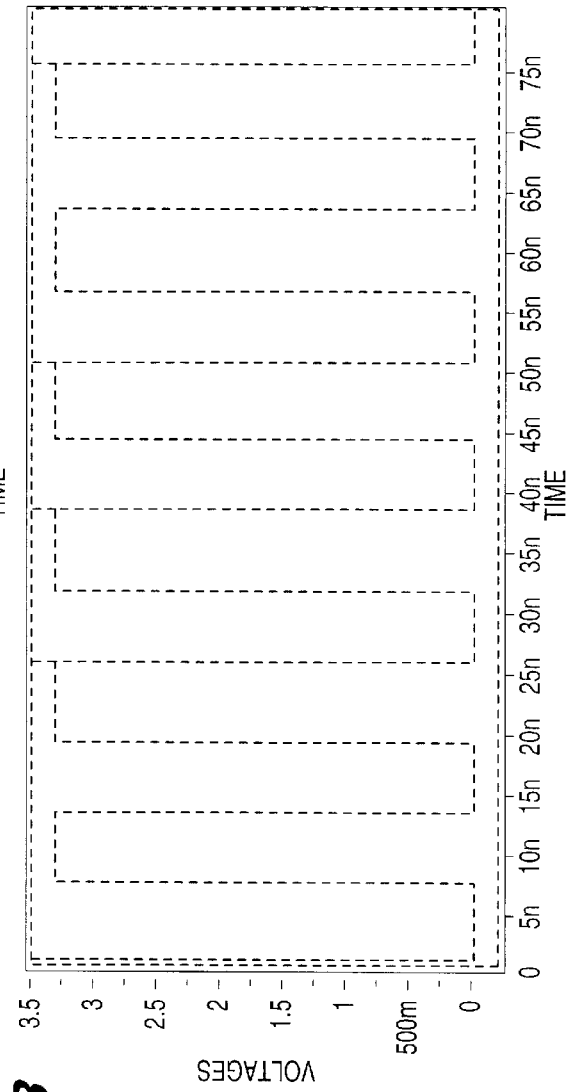

With reference now to FIGS. 8A and 8B, timing diagrams from simulation results of input and output signals are depicted according to the present invention. FIG. 8A is a plot showing an input clock into a clock doubler, such as the one illustrated in FIG. 5. FIG. 8B is a plot of the frequency doubler output signal from a clock doubler circuit constructed according to the present invention.

Thus, the present invention provides an improved method and apparatus for doubling a frequency of an input signal. With the depicted example in FIG. 5, a complete clock doubler circuit according to the present invention is about one-tenth the size of a PLL, which is what is now presently used for clock doubling. Additionally, the present invention may be made to fit in a digital cell row and use a digital power bus. The simulations indicate that a fifty percent duty cycle can be obtained with a +\− ten percent duty cycle from a best or worst case.

The description of the preferred embodiment of the present invention has been presented for purposes of illustration and description, but is not limited to be exhaustive or limited to the invention in the form disclosed. Many modifications and variations will be apparent to those of ordinary skill in the art. That the embodiment was chosen and described in order to best explain the principles of the invention the practical application to enable others of ordinary skill in the art to understand the invention for various embodiments with various modifications as are suited to the particular use contemplated.

What is claimed is:

1. An apparatus for multiplying a clock signal comprising:
   a phase interpolator having an output and a pair of inputs comprising a first clock input and a second clock input, wherein the inputs receive complementary clock signals; and
   An exclusive OR gate having an output and a pair of inputs comprising a first input and a second input, the first input being connected to one of the complementary clock signals and the second input being connected to the output of the phase interpolator, wherein a multiplied clock signal is generated at the output of the exclusive OR gate.

2. The apparatus of claim 1, wherein the phase interpolator outputs a phase-shifted signal which is 90° out of phase with the complementary clock signals.

3. The apparatus of claim 2, wherein the first exclusive OR gate input receives the second clock signal and the second exclusive OR gate input receives the phase-shifted signal.

4. An apparatus for multiplying a clock signal comprising:
   a phase interpolator having a pair of outputs comprising a first output and a second output, and a pair of inputs comprising a first input and a second input, wherein the inputs receive complementary clock signals;
   a differential to single ended converter having two inputs and an output, wherein the inputs of the differential to single ended converter are connected to the outputs of the phase interpolator;
   a first exclusive OR gate having an output and a pair of inputs, a first input and a second input, the first input being connected to one of the complementary clock signals and the second input being connected to the output of the differential to single ended converter, wherein a first multiplied clock signal is generated at the output of the first exclusive OR gate; and
   a second exclusive OR gate having an output and a pair of inputs, a first input and a second input, the first input being connected to the other one of the complementary clock signals and the second input being connected to the output of the differential to single ended converter, wherein a second multiplied clock signal is generated at the output of the second exclusive OR gate, wherein the output of the first exclusive OR gate is a complementary signal to the output of the second exclusive OR gate.

5. The apparatus of claim 4, wherein the phase interpolator outputs complementary phase-shifted signals which are about 90° out of phase with the complementary clock signals.

6. The apparatus of claim 5, wherein the phase interpolator outputs a first phase-shifted signal which is about 90° out of phase with a first clock signal received at the first clock input and a second phase-shifted signal which is about 90° out of phase with a second clock signal received at the second clock input, wherein the first and second clock signals comprise the complementary clock signals.

7. The apparatus of claim 6, wherein the differential to single ended converter receives the first and second phase-shifted signals and outputs a third phase-shifted signal in phase with the first phase-shifted signal.

8. The apparatus of claim 6, wherein the differential to single ended converter receives the first and second phase-shifted signals and outputs a third phase-shifted signal in phase with the second phase-shifted signal.

9. The apparatus of claim 8, wherein:
   the first exclusive OR gate receives the first clock signal and the third phase-shifted signal; and
   the second exclusive OR gate receives the second clock signal and the third phase-shifted signal.

10. A clock doubler circuit for doubling the frequency of an input signal comprising:
    phase interpolation means for generating a phase interpolated signal having a phase between a first input signal and a second input signal, wherein the first input signal is a complementary signal to the second input signal; and
    exclusive OR means for exclusive ORing the phase interpolated signal and the second input signal to produce an output signal having a frequency that is double that of the input signal.

11. The clock doubler circuit of claim 10, wherein the phase interpolation means generates a phase-shifted signal which is about 90° out of phase with the second input signal.

12. The clock doubler circuit of claim 10, wherein the phase interpolation means further comprises:

a phase interpolator having first and second inputs and first and second outputs, the phase interpolator receiving the first input signal at the first input and the second input signal at the second input, the phase interpolator generating a first phase-shifted signal and a second phase-shifted signal; and a differential to single ended converter having first and second inputs and an output, the differential to single ended converter receiving the first and second phase-shifted signals and generating a third phase-shifted signal in phase with the second phase shifted signal.

13. The clock doubler circuit of claim 12, wherein the first phase-shifted signal is about 90° out of phase with the first input signal and the second phase-shifted signal is about 90° out of phase with the second input signal.

14. A method for multiplying a frequency of an input signal, the method comprising:

receiving a first input signal and a second input signal;

interpolating the first input signal and the second input signal, wherein a phase interpolated signal having a phase between the first input signal and the second input signal is generated; and exclusive ORing the phase interpolated signal with one of the two input signals to generate an output signal.

15. The method of claim 14, wherein the step of receiving a first input signal and a second input signal further comprises:

receiving complementary input signals.

16. The method of claim 15, wherein the step of interpolating the first input signal and the second input signal further comprises:

interpolating the complementary input signals to generate the phase interpolated signal, wherein the phase interpolated is 90° out of phase with the complementary signals.

17. The method of claim 15, wherein the step of exclusive ORing the phase interpolated signal with one of the two input signals to generate an output signal further comprises:

exclusive ORing the phase interpolated signal with the second input signal.

* * * * *